(12) United States Patent
Ko et al.

(10) Patent No.: US 9,030,224 B2
(45) Date of Patent: May 12, 2015

(54) SEMICONDUCTOR INTEGRATED CIRCUIT

(75) Inventors: Jae Bum Ko, Icheon-si (KR); Sang Jin Byeon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 682 days.

(21) Appl. No.: 13/339,121

(22) Filed: Dec. 28, 2011

(65) Prior Publication Data

US 2012/0249222 A1    Oct. 4, 2012

(30) Foreign Application Priority Data

Mar. 28, 2011    (KR) ........................ 10-2011-0027579

(51) Int. Cl.
| | | |
|---|---|---|
| *G01R 31/02* | (2006.01) | |
| *G06F 1/32* | (2006.01) | |
| *G01R 31/3185* | (2006.01) | |
| *G11C 5/14* | (2006.01) | |
| *G11C 29/02* | (2006.01) | |

(52) U.S. Cl.
CPC .......... *G06F 1/32* (2013.01); *G01R 31/318558* (2013.01); *G11C 5/14* (2013.01); *G11C 29/021* (2013.01)

(58) Field of Classification Search
USPC ................. 324/537, 750.01, 750.15, 759.01, 324/750.3, 762.01–762.06, 764.01
See application file for complete search history.

(56) References Cited

U.S. PATENT DOCUMENTS

| | | | |
|---|---|---|---|
| 3,913,072 A | * | 10/1975 | Catt .............................. 714/724 |
| 2007/0014166 A1 | * | 1/2007 | Goldin .......................... 365/200 |
| 2011/0058431 A1 | * | 3/2011 | Gunwani et al. ......... 365/189.16 |
| 2011/0093224 A1 | * | 4/2011 | Ide et al. ........................ 702/64 |

* cited by examiner

*Primary Examiner* — Jermele M Hollington
*Assistant Examiner* — Dustin Dickinson
(74) *Attorney, Agent, or Firm* — William Park & Associates Ltd.

(57) ABSTRACT

A semiconductor integrated circuit includes a plurality of dies, wherein each of the dies is configured to enable a power circuit provided therein according to a power control signal, in a state in which the die was determined to be a good die or a fail die.

3 Claims, 2 Drawing Sheets

SEMICONDUCTOR INTEGRATED CIRCUIT

CROSS-REFERENCES TO RELATED APPLICATION

The present application claims priority under 35 U.S.C. §119(a) to Korean application number 10-2011-0027579, filed on Mar. 28, 2011, in the Korean Intellectual Property Office, which is incorporated herein by reference in its entirety as set forth in full.

BACKGROUND

1. Technical Field

The present invention relates to a semiconductor circuit, and more particularly, to a semiconductor integrated circuit.

2. Related Art

A semiconductor integrated circuit may include one is semiconductor die (or chip) or a plurality of semiconductor dies (hereafter, referred to as dies).

The plurality of dies may include power circuits, respectively. The respective power circuits of the dies are electrically coupled to each other so as to share power.

The semiconductor integrated circuit determines whether each of the dies is a good die or a fail die through a test.

A die which is determined to be a fail die among the plurality of dies is set so as not to operate when all internal circuits of the fail die including the power circuit perform a normal operation.

At this time, the power circuit is designed in consideration of the entire power consumption of the semiconductor integrated circuit, thereby stabilizing power supply. For example, the size or the kind of drivers composing the power circuit is designed in consideration of the entire power consumption.

Therefore, as described above, when the power circuit of a die of the plurality of dies is determined as a fail die, the power circuit is not operated during a normal operation; thus, the power supply of the whole semiconductor integrated circuit may be destabilized.

SUMMARY

A semiconductor integrated circuit capable of stabilizing power is described herein.

In one embodiment of the present invention, a semiconductor integrated circuit includes a plurality of dies, wherein is each of the dies is configured to enable a power circuit provided therein according to a power control signal, in a state in which each of the dies was determined to be a good die or a fail die.

In another embodiment of the present invention, a semiconductor integrated circuit includes a power circuit, wherein when a power control signal is deactivated, the power circuit is enabled according to whether the semiconductor integrated circuit is determined to be a good die or fail die, and when the power control signal is activated, the power circuit is enabled regardless of whether the semiconductor integrated circuit is determined to be a good die or fail die.

Still another embodiment includes a method of enabling a power circuit of at least one die included in a plurality of dies, the method comprising: receiving a power control signal at the at least one die; determining whether the at least one die is one of a good die or a fail die; and activating the power circuit if the at least one die receives an activated power control signal and the at least one die is a fail die.

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit according to embodiments the present invention will be described below with reference to the accompanying drawings through example embodiments.

Figure 1:
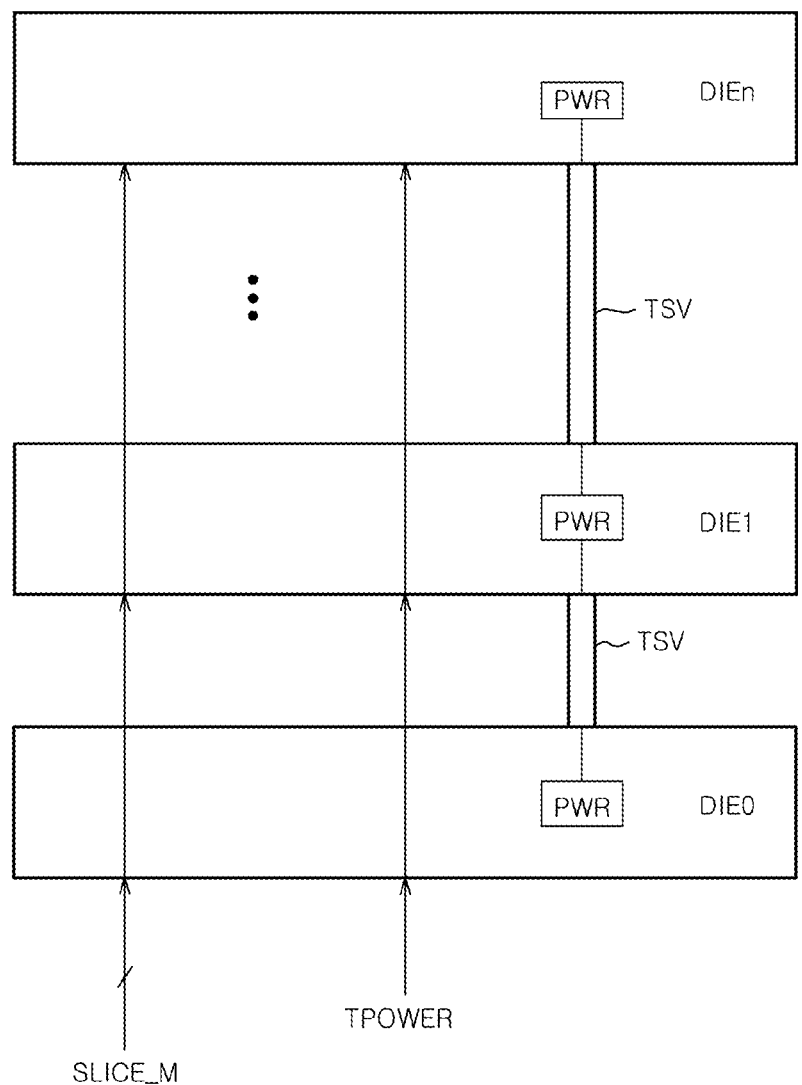
FIG. 1 is a block diagram of a semiconductor integrated circuit according to one embodiment.

FIG. 1 illustrates a three-dimensional stack-type semiconductor integrated circuit including a plurality of dies DIE0 to DIEn which are coupled through a through silicon via TSV.

Referring to FIG. 1, the semiconductor integrated circuit 100 according to one embodiment includes the plurality of dies DIED to DIEn.

Power circuits PWR of the plurality of dies DIE0 to DIEn include power output terminals coupled to each other through the through silicon via TSV.

FIG. 1 illustrates an example in which the power circuits PWR are coupled through the through silicon via TSV, but the embodiment of the present invention may be applied to all types of couplings in which power circuits are coupled and shared by a plurality of dies.

Each of the dies DIE0 to DIEn is configured to enable the power circuit PWR in response to an external signal, that is, a die select signal SLICE_M; and another external signal, that is, a power control signal TPOWER.

At this time, the die select signal SLICE_M is a signal for selecting any one of the dies DIE0 to DIEn.

Each of the dies DIE0 to DIEn is configured to determine whether the die is selected, in response to the die select signal SLICE_M.

Each of the dies DIE0 to DIEn is configured to enable the power circuit PWR regardless of the die select signal SLICE_M, when the power control signal TPOWER is activated.

Figure 2:
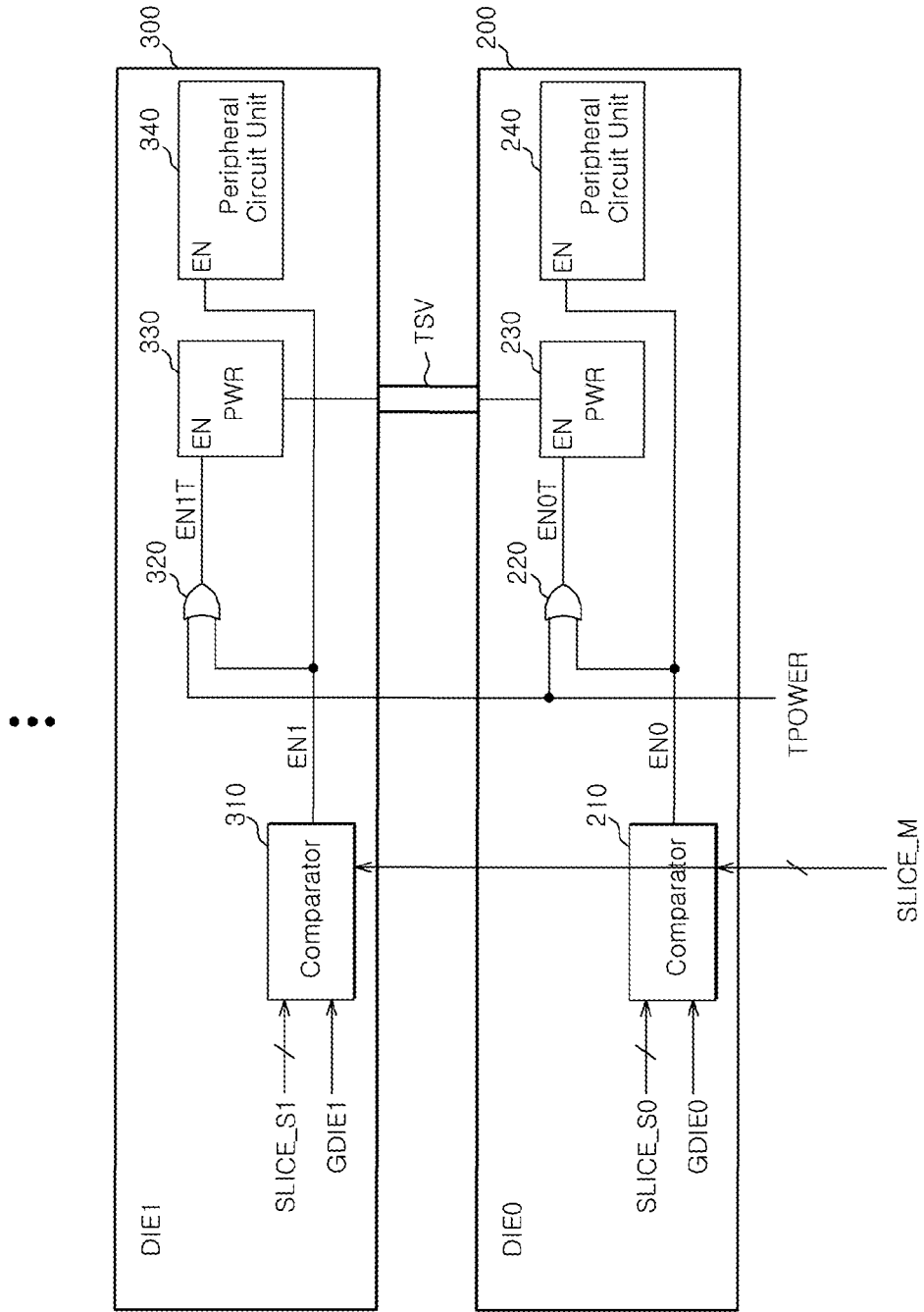
FIG. 2 is an internal configuration diagram of dies of FIG. 1.

Referring to FIG. 2, the plurality of dies DIE0 to DIEn may be configured in the same manner as FIG. 1, but FIG. 2 provides further detail of an internal configuration of some of the plurality of dies DIE0 to DIEn.

Among the plurality of dies DIE0 to DIEn, the internal configuration of dies DIE0 and DIE1 (200 and 300) will be described.

The die 200 includes a comparator 210, an OR gate 220, a power circuit 230, and a peripheral circuit unit 240.

The comparator 210 is configured to generate an internal enable signal EN0 in response to a die ID SLICE_S0, a good die determination signal GDIE0, and a die select signal SLICE_M.

The die ID SLICE_S0 is a signal which is internally set to define a unique number of the die 200, and different die IDs are set to the plurality of dies DIE0 to DIEn, respectively.

The good die determination signal GDIE0 is a signal for defining whether the die 200 is a good die or fail die according to a test result.

The comparator 210 enables the internal enable signal EN0 when the die ID SLICE_0 has a value corresponding to the die select signal SLICE_M and the good die determination signal GDIE0 has a level defining that a product is normal (for example, a high level).

The OR gate 220 is configured to activate a power enable signal ENOT when any one of the internal enable signal EN0 and the power control signal TPOWER is activated.

The power circuit 230 is configured to generate power in response to the activation of the power enable signal ENOT.

The peripheral circuit unit 240 is configured to operate in response to the activation of the internal enable signal EN0.

The die 300 includes a comparator 310, an OR gate 320, a power circuit PWR 330, and a peripheral circuit unit 340.

The comparator 310 is configured to generate an internal enable signal EN1 in response to a die ID SLICE_S1, a good die determination signal GDIE1, and a die select signal SLICE_M.

The comparator 310 activates the internal enable signal EN1 when the die ID SLICE_S1 has a value corresponding to the die select signal SLICE_M and the good die determination signal GDIE1 has a level defining that a product is normal.

The OR gate 320 is configured to activate a power enable signal EN1T when any one of the internal enable signal EN1 and the power control signal TPOWER is activated.

The power circuit 330 is configured to generate power in response to the activation of the power enable signal EN1T.

The peripheral circuit unit 340 is configured to operate in is response to the activation of the internal enable signal EN1.

The operation of the semiconductor integrated circuit 100 according to the embodiment will be described as follows.

In the following descriptions, it is assumed that a die DIE1 of the dies DIED to DIEn was determined to be a fail die, and the others were determined to be good dies.

Since the die DIE1 was determined to be a fail die, the good die determination signal GDIE1 has a level defining that the die DIE1 is a fail die, for example, a low level.

Since the good die determination signal GDIE1 is at a low level, the comparator 310 deactivates the internal enable signal EN1 to a low level.

Since the internal enable signal EN1 is at a low level, the peripheral circuit unit 340 is disabled.

At this time, when the power control signal TPOWER is deactivated in a state where the internal enable signal EN1 is at a low level, the power circuit 330 is disabled.

The power control signal TPOWER is activated even though the internal enable signal EN1 is at a low level, and thus the power circuit 330 is enabled.

For example, a power state may be determined through a series of test processes, and the power control signal TPOWER may still be maintained in an activation state when it is determined that the operation of the power circuit of the fail die is required.

At this time, the power control signal TPOWER may be is activated or deactivated by a fuse set or test mode.

In accordance with an embodiment of the present invention, although the die DIE1 is determined to be a fail die, the power circuit 330 of the die DIE1 may be used.

Therefore, although a fail die occurs among the entire dies, power may be stably supplied.

While certain embodiments have been described above, it will be understood to those skilled in the art that the embodiments described are by way of example only. Accordingly, the semiconductor integrated circuit described herein should not be limited based on the described embodiments. Rather, the semiconductor integrated circuit described herein should only be limited in light of the claims that follow when taken in conjunction with the above description and accompanying drawings.

What is claimed is:

1. A semiconductor integrated circuit comprising a plurality of dies, wherein each of the dies comprises:
    a power circuit configured to generate power in response to an activation of a power enable signal,
    a comparator configured to generate an internal enable signal in response to a good die determination signal, and
    a logic element configured to activate the power enable signal by combining the internal enable signal and the power control signal,
    wherein the logic element activates the power enable signal in response to an activation of the power control signal when the good die determination signal has a level defining that the each of the dies is a fail die.

2. The semiconductor integrated circuit of claim 1, wherein the power circuits of the plurality of dies comprise power output terminals coupled to each other.

3. The semiconductor integrated circuit of claim 1, wherein the comparator is configured to generate the internal enable signal in response to the good die determination signal, a die ID, and a die select signal.

* * * * *